United States Patent
Watanabe

(10) Patent No.: US 6,674,469 B1
(45) Date of Patent: Jan. 6, 2004

(54) DRIVING METHOD FOR SOLID-STATE IMAGE PICKUP DEVICE

(75) Inventor: Tohru Watanabe, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/520,732

(22) Filed: Mar. 8, 2000

(30) Foreign Application Priority Data

Mar. 10, 1999 (JP) ........................................ HEI 11-63567

(51) Int. Cl.$^7$ ............................ H04N 5/335; H04N 3/14
(52) U.S. Cl. ........................................ 348/296; 348/312
(58) Field of Search ................................ 348/296, 297, 348/311, 312, 314, 317, 294; 257/229

(56) References Cited

U.S. PATENT DOCUMENTS

| | | | |
|---|---|---|---|
| 4,774,585 A | * | 9/1988 | Suga et al. ................... 348/318 |
| 5,757,427 A | * | 5/1998 | Miyaguchi ................... 348/317 |
| 6,040,859 A | * | 3/2000 | Takahashi ................... 348/243 |
| 6,452,634 B1 | * | 9/2002 | Ishigami et al. ............ 348/322 |

* cited by examiner

*Primary Examiner*—Aung S. Moe
(74) *Attorney, Agent, or Firm*—Hogan & Hartson, LLP

(57) ABSTRACT

A solid-state image pickup device of the frame transfer system is designed to provide two types of image signals. A light receiving section of the solid-state image pickup device adopts a six-phase drive in which second and fifth transfer clocks $\phi 2$ and $\phi 5$ are set high at a first image pickup operation so that a potential well is formed respectively under the corresponding transfer electrodes. After completion of the first image pickup operation, information charges in the potential well under the transfer electrode corresponding to the second transfer clock $\phi 2$ are transferred to the potential well under the transfer electrode corresponding to the fifth transfer clock $\phi 5$. At a second image pickup operation, the second and fifth transfer clocks $\phi 2$ and $\phi 5$ are again set high so that a potential well is formed respectively under the corresponding transfer electrodes. After completion of the second image pickup operation, the respective potential wells are transferred and output independently.

3 Claims, 5 Drawing Sheets

DRIVING METHOD FOR SOLID-STATE IMAGE PICKUP DEVICE

BACKGROUND OF THE INVENTION

1. Field of the Invention

The present invention relates to a driving method for a solid-state image pickup device of the frame transfer system.

2. Description of the Prior Art

FIG. 1 is a top plan view schematically showing a CCD solid-state image pickup device of the frame transfer system, and FIG. 2 is a timing chart illustrating the operation of the solid-state image pickup device.

The solid-state image pickup device of the frame transfer system comprises a light receiving section 1, a storage section 2, a horizontal transfer section 3, and an output section 4. The light receiving section 1 comprises a plurality of shift registers, having a plurality of consecutive bits in the vertical direction, arranged so as to be parallel to each other. Each bit of these shift registers forms a light receiving bit. Each light receiving bit generates and accumulates information charges corresponding to an object image. The storage section 2 is formed from a plurality of shift registers consecutive to each shift register of the light receiving section 1. Each bit of these shift registers forms a storage bit, and each storage bit temporarily stores the information charge transferred from the light receiving section 1. The horizontal transfer section 3 comprises a single shift register, to which each bit is connected the respective output of the plurality of shift registers of the storage section 2, and receives, then sequentially transfers and outputs in the horizontal direction, one line at a time the information charges of one screen stored in the storage section 2. The output section 4 is formed from an electrically independent capacitor and an amplifier obtaining the change in electric potential of the capacitor, and the information charge that is output from the horizontal transfer section 3 is received at the capacitor one bit at a time and converted to a voltage value and output as image signal Y0.

To the light receiving section 1 is applied a frame transfer clock $\phi F$ for transferring at high speed the information charge of the light receiving section 1 to the storage section 2 within the blanking period of a vertical scan in synchronization with a vertical synchronization signal VD. To the storage section 2 is applied a vertical transfer clock $\phi V$ for loading the information charges that are transferred and output from the light receiving section 1 by the frame transfer clock $\phi F$ as well as for transferring the loaded information charges for one screen to the horizontal transfer section 3 one line at a time within the blanking period of a horizontal scan in synchronization with a horizontal synchronization signal HD. Then, to the horizontal transfer section 3 is applied a horizontal transfer clock $\phi H$ for transferring the information charges that are loaded into the horizontal transfer section 3 one line at a time in response to the vertical transfer clock $\phi V$ to the sequential output section 4 in synchronization with the horizontal synchronization signal HD. As a result, the information charges generated at the light receiving section 1, after being transferred to the storage section 2 in one-screen units, are transferred and output one line at time to the output section 4 via the horizontal transfer section 3, and the image signal Y0 is output in consecutive one line units.

Furthermore, a substrate clock $\phi B$, which rises for a predetermined period during the vertical scan period, is applied to the semiconductor substrate that forms the solid-state image pickup device. In response to the rise of the substrate clock $\phi B$, the frame transfer clock $\phi F$ is clocked at the same period as during frame transfer, and the information charges of the light receiving section 1 are completely discharged to the substrate. Therefore, a period L, from the completion of the discharge operation of information charges by the substrate clock $\phi B$ to the initiation of the transfer operation by the frame transfer clock $\phi F$, becomes the storage time of the information charges. The image signal Y0 represents a level that is proportional to the quantity of information charges accumulated in each light receiving pixel of the light receiving section 1 during the storage time L.

In the case of the solid-state image pickup device of the frame transfer system, the storage performance of the information charge of each light receiving pixel is attributed to the capacity of the potential well formed within the substrate by effect of the transfer electrode located in the light receiving section 1. The capacity of this potential well is determined, for example, by the width of the transfer electrode and width of the transfer channel, and further the voltage of the pulse driving the transfer electrode.

When the width of the transfer electrode or width of the transfer channel narrows with the increased resolution of the solid-state image pickup device, the capacity of the potential well that is formed decreases and the storage performance of the information charge of each light receiving pixel lowers. Furthermore, when the driving pulse is lowered in voltage in order to reduce the power consumption of the device, the capacity of the potential well that is formed decreases further. Therefore, the dynamic range of the solid-state image pickup device becomes narrow and the image pickup conditions become restricted.

SUMMARY OF THE INVENTION

It is therefore an object of the present invention to provide a driving method that is capable of extending the dynamic range of the solid-state image pickup device.

The driving method for the solid-state image pickup device, having transfer electrodes corresponding to at least six phases of transfer clocks and storing information charges in potential wells formed by effect of these transfer electrodes, is characterized by forming a potential well at two locations with at least two transfer electrodes therebetween among transfer electrodes corresponding to transfer clocks of at least six phases, as well as setting the storage time for one potential well to be shorter than the storage time for the other potential well and transferring and outputting the potential well at the two locations independently of each other.

According to the present invention, even if one potential well overflows, the storage of information charges can be performed without overflow at the other potential well because of independently reading out the two potential wells with different storage times of information charges. Then, by adding the outputs from both potential wells, the quantity of incident light to the light receiving pixels can be represented over a wide range.

DESCRIPTION OF THE PREFERRED EMBODIMENTS

Figure 1:
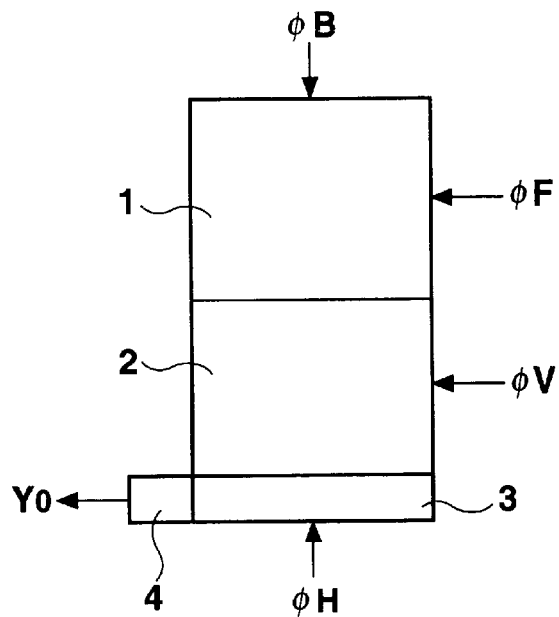
FIG. 1 is a schematic top plan view of a solid-state image pickup device of a frame transfer system.
Figure 2:
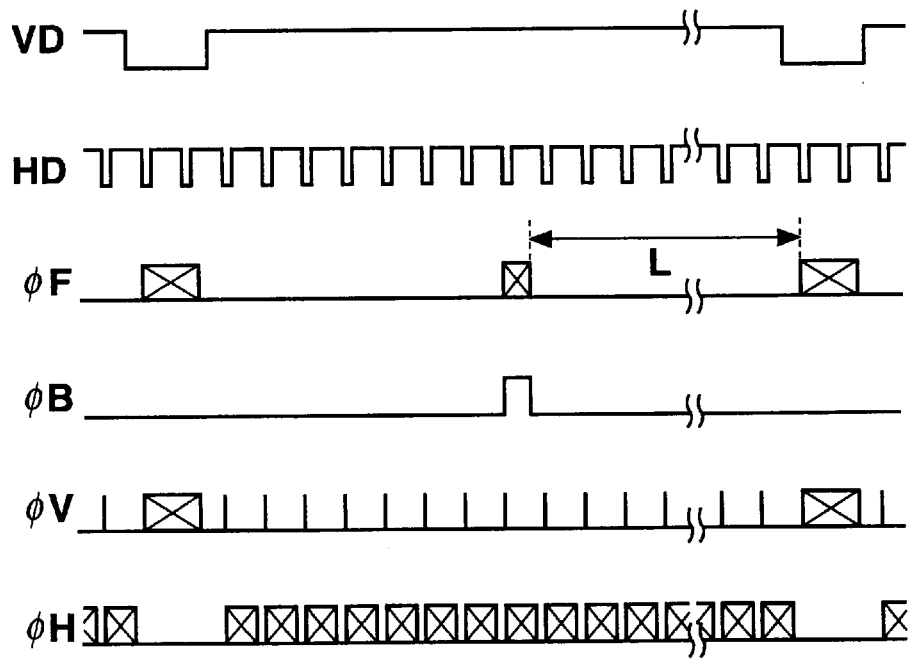
FIG. 2 is a timing chart illustrating a conventional driving method.
Figure 3:
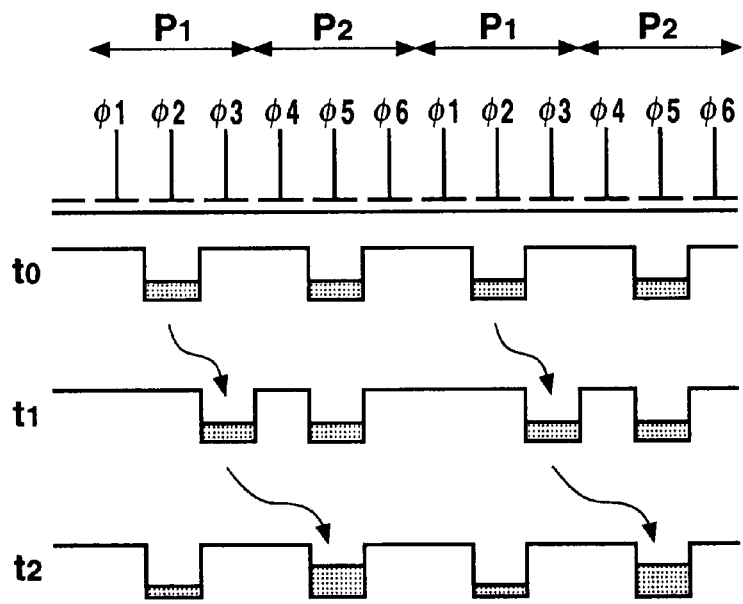
FIG. 3 is a potential diagram showing a first embodiment of the present invention.
Figure 4:
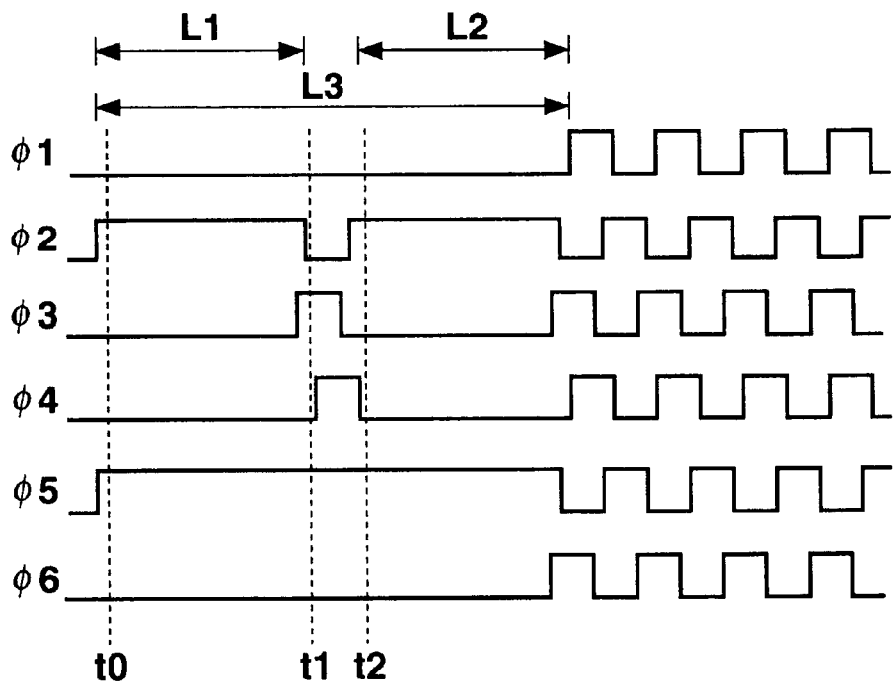
FIG. 4 is a waveform diagram of driving clocks of the first embodiment of the present invention.

FIG. 3 is a potential diagram showing a first embodiment of the driving method for the solid-state image pickup device of the present invention, and FIG. 4 is a timing chart of transfer clocks achieving the operation thereof. In FIG. 3, a cross section is shown of the light receiving section of the solid-state image pickup device of the frame transfer system shown in FIG. 1.

Transfer electrodes corresponding to transfer clocks $\phi1$ through $\phi6$ of six phases are arranged in the light receiving section of the solid-state image pickup device. In the driving method of the present invention, two pixels P1 and P2 are substantially formed with respect to the transfer electrodes for six phases.

When a first image pickup operation is initiated, the second transfer clock $\phi2$ and the fifth transfer clock $\phi5$ rise and a potential is deeply formed under the respective transfer electrodes applied with the transfer clocks $\phi2$ and $\phi5$. At this time, the other transfer clocks $\phi1$, $\phi3$, $\phi4$, and $\phi6$ remain low so that the potential remains shallow under the transfer electrodes applied with the transfer clocks $\phi1$, $\phi3$, $\phi4$, and $\phi6$. As a result, at timing t0 during a first charge storage period, potential wells are formed under the transfer electrodes applied with the transfer clocks $\phi2$ and $\phi5$, and at these potential wells are accumulated information charges generated by photoelectric conversion.

At the elapse of a predetermined period L1 from the initiation of storage of information charges, the third transfer clock $\phi3$ rises, and in succession, the second transfer clock $\phi2$ falls. At timing t1 after the second transfer clock $\phi2$ falls, the potential well storing the information charges, along with the information charges accumulated during period L1, moves from under the transfer electrode applied with the transfer clock $\phi2$ to under the transfer electrode applied with the third transfer clock $\phi3$. Furthermore, when the third transfer clock $\phi3$ falls after the fourth transfer clock $\phi4$ rises, the potential well, along with the information charges, moves from under the transfer electrode applied with the third transfer clock $\phi3$ to under the transfer electrode applied with the fourth transfer electrode $\phi4$. At this time, the information charges accumulated during period L1 under the transfer electrode applied with the second transfer clock $\phi2$ combines with the information charges accumulated under the transfer electrode applied with the fifth transfer clock $\phi5$ during the same period L1.

Then, after the second transfer clock $\phi2$ is set high, the fourth transfer clock $\phi4$ is set low so as to initiate a second image pickup operation. As a result, at timing t2 during the charge storage period, similar to timing t0, potential wells are formed under the transfer electrodes applied with the transfer clocks $\phi2$ and $\phi5$, and at these potential wells are again accumulated information charges generated by photoelectric conversion. The second image pickup operation continues during period L2.

At the potential well under the transfer electrode applied with the second transfer clock $\phi2$, information charges are hardly accumulated at the initiation of the second image pickup operation. As a result of this, at the potential well under the transfer electrode applied with the second transfer clock $\phi2$, namely, a first light receiving pixel P1, only the information charges generated during period L2, when the second storage operation is performed, are accumulated. On the other hand, at the potential well under the transfer electrode applied with the fifth transfer clock $\phi5$, the information charges accumulated in the two potential wells during period L1, when the first image pickup operation was performed, are stored also at the initiation of the second image pickup operation. As a result of this, at the potential well under the transfer electrode applied with the fifth transfer clock $\phi5$, namely, a second light receiving pixel P2, information charges generated during period L3, which continues from the first image pickup operation until the second image pickup operation, are accumulated, and furthermore, the information charges generated at the first light receiving pixel P1 during period L1, when the first image pickup operation is performed, are added.

After completion of the above-mentioned first and second image pickup operations, the first through sixth transfer clocks $\phi1$ through $\phi6$ are clocked with a mutual phase difference of $2\pi/3$, and the respective information charges of each light receiving pixel P1 and P2 are transferred and output independently. As a result, the output corresponding to the first light receiving pixel P1 and the output corresponding to the second light receiving pixel P2 show the following relationship:

$$P1:P2=L2:(L1+L3)$$

Figure 5:
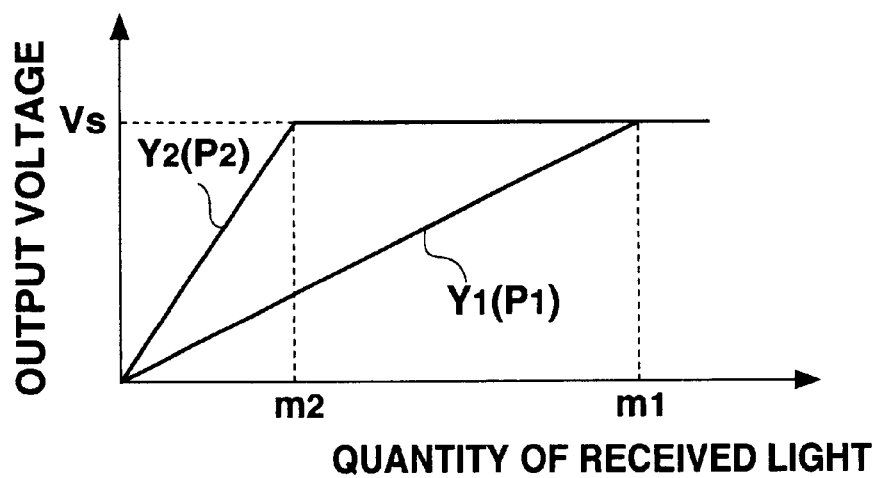
FIG. 5 shows a relationship between quantity of received light and output voltage.

Since the light receiving pixels P1 and P2 normally have equal storage capacities of information charges, the second light receiving pixel P2 becomes saturated at a smaller quantity of incident light. For example, as shown in FIG. 5, when the output voltage of the first light receiving pixel P1 reaches the saturation level Vs at a quantity of received light m1, the output voltage of the second light receiving pixel P2 reaches the saturation level Vs at a quantity of received light m2, which is smaller than the quantity of received light m1.

Figure 6:
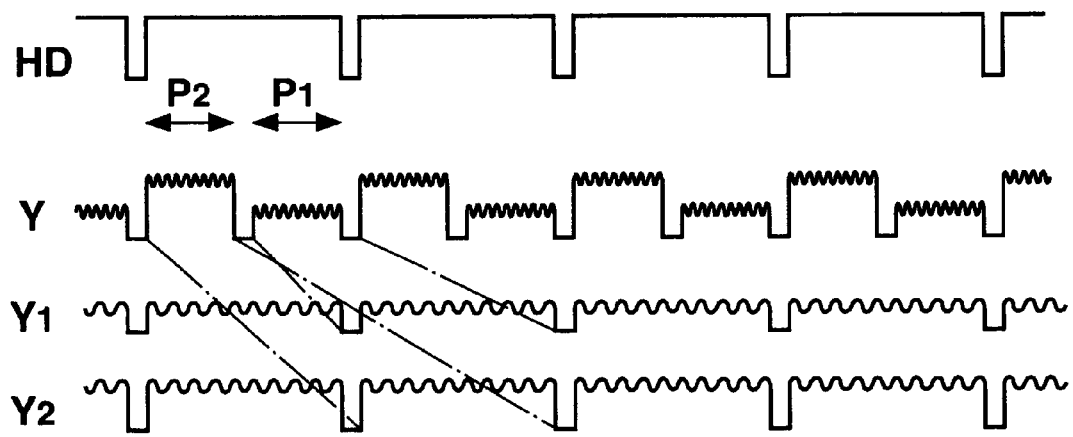
FIG. 6 is a waveform diagram of image signals that are output.

In the case of a pickup operation for a moving image, the output from the solid-state image pickup device completes in one horizontal scan period the output from the line corresponding to the first light receiving pixel P1 and the output from the line corresponding to the second light receiving pixel P2. For example, in the solid-state image pickup device shown in FIG. 1, the period of the line advance pulse of the vertical transfer clock $\phi V$ applied to the storage section 2 is set to ½ and the period of the horizontal transfer pulse supplied to the horizontal transfer section 3 is set to ½. As a result, at the image signal Y, as shown in FIG. 6, the information corresponding to the line of the first light receiving pixel P1 and the line of the second light receiving pixel P2 is output. Since the time is compressed in the horizontal direction, the image signal Y that is output here has the time axis expanded independently of the line of the first pixel P1 and the line of the second pixel P2 during signal processing so that two types of image signals Y1 and Y2 are generated.

Figure 7:
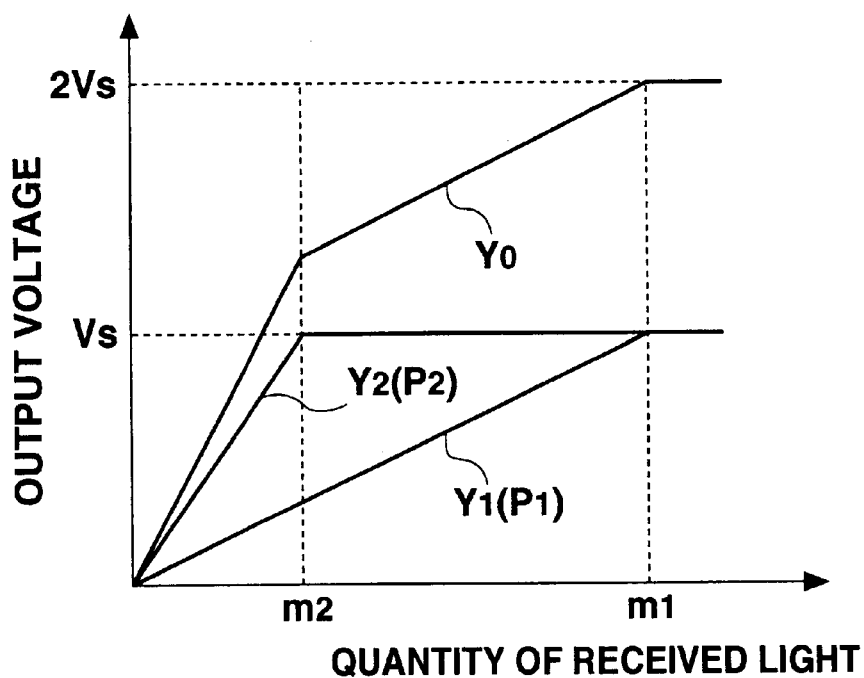
FIG. 7 shows a relationship between quantity of received light and output voltage.

The above-mentioned two types of image signals Y1 and Y2 each has a different light receiving sensitivity so that if they are added to each other to produce one signal, the dynamic range of the solid-state image pickup device can be extended. For example, when the image signals Y1 and Y2 are added to each other, the image signal Y0 that is obtained as the addition result has an output voltage that can be varied according to the quantity of received light, as shown in FIG. 7, until the quantity of received light reaches m1. If only the dynamic range is observed here, the image signal Y1 varies over the same range of quantity of received light as the image signal Y0. However, since the image signal Y1 drops in light receiving sensitivity at low brightness, a sufficient output cannot be obtained when the quantity of received light is low. In contrast to this, in the case of the image signal Y0, the dynamic range can be extended while an output of sufficient level is obtained even at low brightness.

The image signal Y0, which is the result of adding the image signal Y1 and the image signal Y2, has a different output level with respect to the quantity of received light, namely, a different apparent light receiving sensitivity, when the quantity of received light is between 0 and m2, and when the quantity of received light is between m2 and m1. However, from the fact that high sensitivity results when the quantity of received light is low and low sensitivity results when the quantity of received light is high, the ratio of periods L1 and L2, when image pickup operations are performed, can be optimized and the characteristics of the change in the output voltage with respect to the quantity of received light can be approximated to the gamma correction curve, thereby substantially eliminating any visual deficiency in the reproduction screen.

Figure 8:
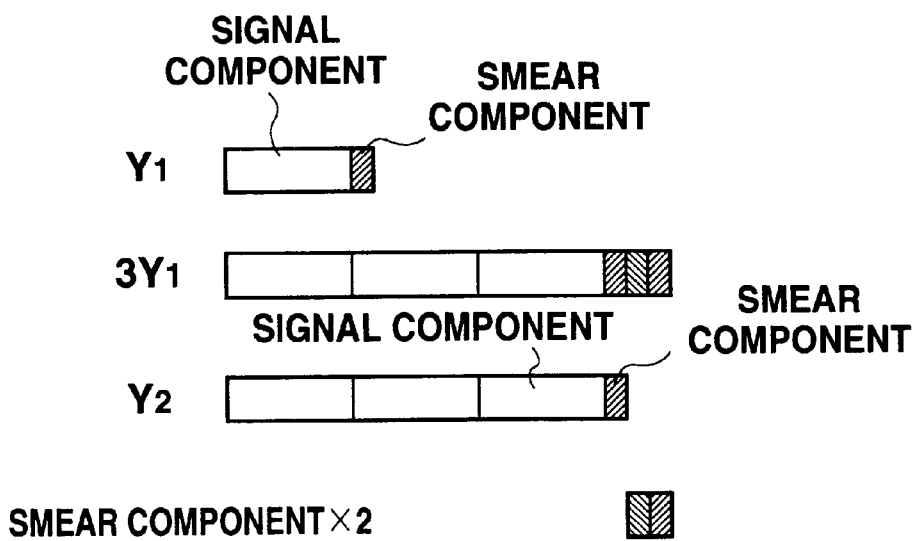
FIG. 8 shows a relationship between signal components and smear components.

Furthermore, the two types of image signals Y1 and Y2 can be employed in smear component detection as performed in the following manner. First, the image signal Y1 is scaled according to the ratio of periods L1 and L2, when the respective image pickup operations are performed, so that both levels of the image signals Y1 and Y2 coincide. If period L1 and period L2 are assumed to be equal and the time required for the charge transfer between the first image pickup operation and the second image pickup operation is ignored, L3=L1+L2 results and the ratio of the image signals L2:(L1+L3) becomes 1:3. Thus, if the image signal Y2 is tripled, its signal component will have the same level as the signal component of the image signal Y2 as shown in FIG. 8. Normally, since the image signals Y1 and Y2 contain the proper signal component as well as the smear component that is mixed by the vertical transfer of information charges, the smear component is also tripled in addition to the signal component when the image signal Y1 is tripled. Accordingly, when the image signal Y2 is subtracted from the tripled image signal 3Y1, the signal component is canceled and only the smear component remains. The smear quantity obtained from this subtraction is the result of subtracting the smear component from the tripled smear component and is thus equivalent to a doubled smear component. The doubled smear component can be used without change for subtraction from the image signal Y0 in which the smear component has been doubled as a result of the addition of image signals Y1 and Y2. The smear component calculated in this manner is calculated in one-line units and accurately represents the difference in each line due to the difference in transfer distance. Furthermore, since the timing at which the smear component is obtained substantially matches the timing at which the smear component mixes into the actual image signals Y1 and Y2, the influence of deterioration with time of the object is minimal.

Figure 9:
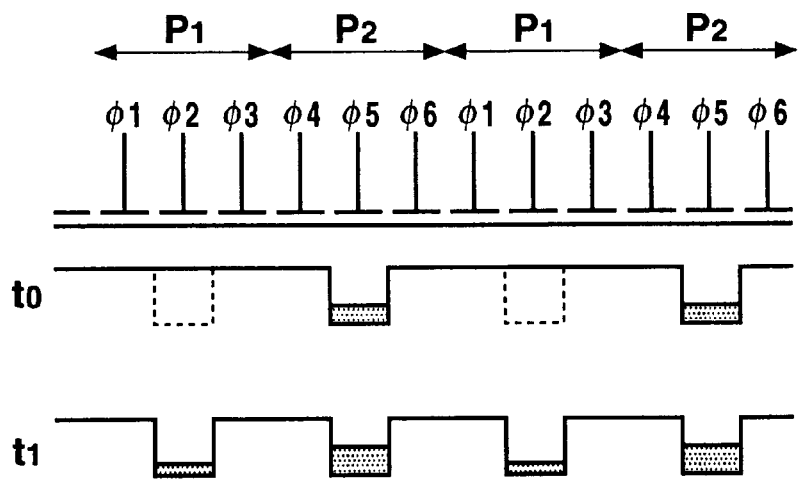
FIG. 9 is a potential diagram showing a second embodiment of the present invention.
Figure 10:
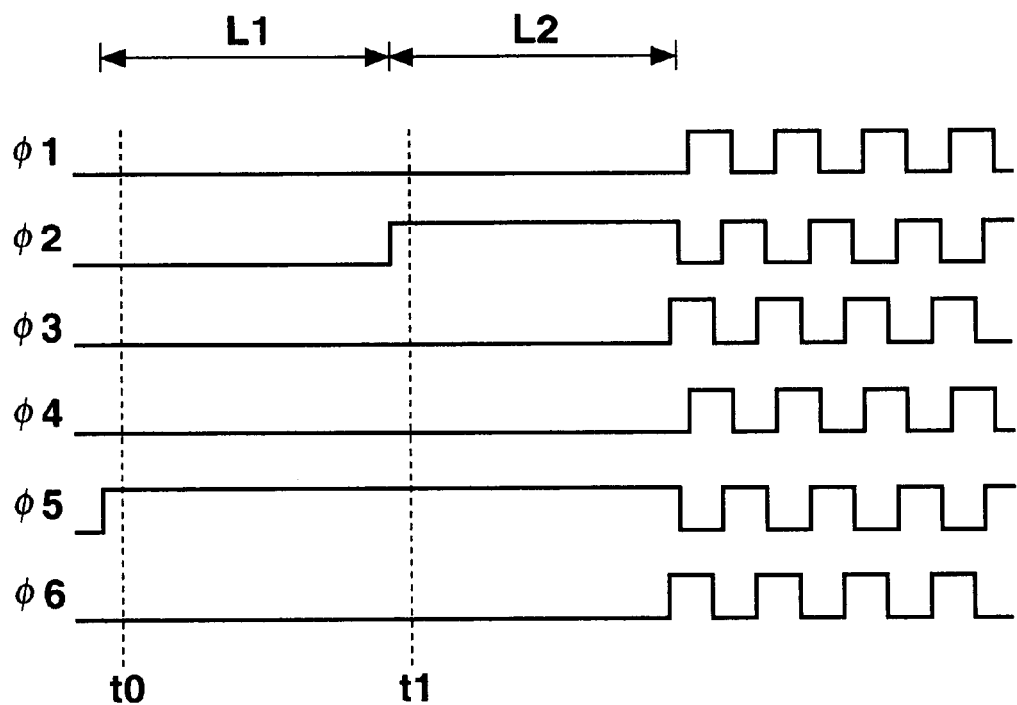
FIG. 10 is a waveform diagram of driving clocks of the second embodiment of the present invention.

FIG. 9 is a potential diagram showing a second embodiment of the driving method for the solid-state image pickup device of the present invention, and FIG. 10 is a timing chart of the transfer clocks achieving the operation thereof. In FIG. 9, a cross section is shown of the light receiving section of the solid-state image pickup device of the frame transfer system shown in FIG. 1.

Transfer electrodes corresponding to transfer clocks $\phi 1$ through $\phi 6$ of six phases are arranged in the light receiving section of the solid-state image pickup device. In the driving method of the present invention, two pixels P1 and P2 are substantially formed with respect to the transfer electrodes for six phases.

When the first image pickup operation is initiated, the fifth transfer clock $\phi 5$ rises and a potential is deeply formed under the transfer electrode applied with the fifth transfer clock $\phi 5$. At this time, the other transfer clocks $\phi 1$ through $\phi 4$ and $\phi 6$ remain low so that the potential remains shallow under the transfer electrodes applied with the transfer clocks $\phi 1$ through $\phi 4$ and $\phi 6$. As a result, at timing to during the first charge storage period, a potential well is formed under the transfer electrode applied with the fifth transfer clock $\phi 5$, and at this potential well are accumulated information charges generated by photoelectric conversion.

The first image pickup operation is completed at the elapse of period L1 from the initiation of storage of information charges, and the second image pickup operation is initiated when the second transfer clock $\phi 2$ rises. At the initiation of the second image pickup operation, only the second transfer clock $\phi 2$ rises and the other transfer clocks $\phi 1$ and $\phi 3$ through $\phi 6$ remain the same as during the first image pickup operation. At timing t1 after the second image pickup operation begins, the potential well storing the information charges also is formed under the transfer electrode applied with the second transfer clock $\phi 2$. As a result, at timing t2 during the charge storage period, a potential wells is formed under the respective transfer electrodes applied with the transfer clocks $\phi 2$ and $\phi 5$, and at these potential wells are again accumulated information charges generated by photoelectric conversion. The second image pickup operation continues during period L2.

At the potential well under the transfer electrode applied with the second transfer clock $\phi 2$, namely, the first light receiving pixel P1, only the information charges generated during the period L2, when the second storage operation is performed, are accumulated. On the other hand, at the potential well under the transfer electrode applied with the fifth transfer clock $\phi 5$, namely, the second light receiving pixel P2, the information charges generated through period L1, when the first image pickup operation is performed, and period L2, when the second image pickup operation is performed, are accumulated.

After completion of the above-mentioned first and second image pickup operations, the first through sixth transfer clocks $\phi 1$ through $\phi 6$ are clocked with a mutual phase difference of $2\pi/3$, and the respective information charges of each light receiving pixel P1 and P2 are transferred and output independently. As a result, the output corresponding to the first light receiving pixel P1 and the output corresponding to the second light receiving pixel P2 show the following relationship:

$$P1:P2=L2:(L1+L2)$$

Except that the ratio of the image signal level corresponding to the first light receiving pixel P1 to the image signal level corresponding to the second light receiving pixel P2 is different, the image signals obtained as described above can be handled in the same manner as the first embodiment. Therefore, expansion of the dynamic range of the solid-state image pickup device and detection of the smear component become possible.

In the above-mentioned embodiments, examples were given for the case where all lines of light receiving pixels arranged in the light receiving section were assigned to the first and second light receiving pixels P1 and P2. However, two adjacent lines among light receiving pixels arranged in three or more consecutive lines may be assigned to the first and second light receiving pixels P1 and P2. For example, with four lines of light receiving pixels, the first line is assigned to the first light receiving pixel P1, the second line is assigned to the second light receiving pixel P2, and the third and fourth lines individually perform storage of information charges without addition of information charges from other pixels.

According to the present invention, two types of image signals can be produced from one solid-state image pickup device, and performing arithmetic processing on these image signals enable expansion of the dynamic range and detection of the smear component.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A driving method for a solid-state image pickup device having a plurality of transfer electrodes and performing storage of information charges by forming light receiving pixels with potential wells formed by effect of the transfer electrodes, said driving method comprising the steps of:

forming a plurality of potential wells every three or more transfer electrodes, as well as sets the time for storing information charges into a particular potential well to be shorter than the time for storing information charges to other potential wells and accumulating information charges in the particular potential well and in other potential wells at mutually different times; and transferring and outputting said plurality of potential wells independently of each other and independently obtains an output corresponding to the particular potential well and outputs corresponding to the other potential wells.

2. The driving method for the solid-state image pickup device according to claim 1 wherein, after information charges accumulated in a particular potential well are transferred to another potential well at the elapse of a first period from initiation of storage, storage of information charges is again initiated at the particular potential well.

3. The driving method for the solid-state image pickup device according to claim 1 wherein a particular potential well is formed at a first timing, and another potential well is formed at a second timing, which is earlier than the first timing.

* * * * *